United States Patent
Moscaluk

(10) Patent No.: US 7,148,745 B1
(45) Date of Patent: Dec. 12, 2006

(54) SLEEP MODE RECOVERY

(75) Inventor: Gary P. Moscaluk, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 77 days.

(21) Appl. No.: 10/950,283

(22) Filed: Sep. 23, 2004

Related U.S. Application Data

(60) Provisional application No. 60/506,712, filed on Sep. 25, 2003.

(51) Int. Cl.
*H03F 1/14* (2006.01)

(52) U.S. Cl. .................... 330/51; 330/291; 330/135

(58) Field of Classification Search ............... 330/51, 330/291, 135
See application file for complete search history.

(56) References Cited

U.S. PATENT DOCUMENTS

| | | | | |
|---|---|---|---|---|
| 3,671,770 A * | 6/1972 | Frederiksen | ............... | 327/513 |
| 4,879,699 A * | 11/1989 | Sakamoto | .................... | 368/63 |
| 5,175,845 A | 12/1992 | Little | .................... | 395/550 |
| 5,241,283 A * | 8/1993 | Sutterlin | .................... | 330/51 |
| 5,262,998 A | 11/1993 | Mnich et al. | ............... | 365/222 |
| 5,548,250 A | 8/1996 | Fang | .......................... | 331/14 |
| 5,818,295 A * | 10/1998 | Chimura et al. | ............ | 327/561 |
| 5,848,014 A | 12/1998 | Yukshing | .................... | 365/227 |
| 5,892,400 A * | 4/1999 | van Saders et al. | ......... | 330/277 |
| 5,925,132 A | 7/1999 | Kadokura | .................... | 713/323 |
| 6,144,251 A | 11/2000 | Ogawa | ...................... | 327/544 |
| 6,167,242 A * | 12/2000 | Henderson et al. | ......... | 455/126 |
| 6,230,277 B1 | 5/2001 | Nakaoka et al. | ............ | 713/320 |
| 6,256,252 B1 | 7/2001 | Arimoto | ...................... | 365/227 |
| 6,310,491 B1 | 10/2001 | Ogawa | ........................ | 326/46 |
| 6,968,469 B1 | 11/2005 | Fleischmann et al. | ...... | 713/324 |
| 6,971,036 B1 | 11/2005 | Freed | ........................ | 713/322 |
| 6,980,823 B1 | 12/2005 | Challa et al. | ............... | 455/522 |
| 2005/0285629 A1* | 12/2005 | Hein et al. | .................. | 326/115 |

* cited by examiner

*Primary Examiner*—Patricia Nguyen

(57) ABSTRACT

One embodiment in accordance with the invention is a circuit. For example, the circuit can include a first stage amplifier coupled to receive a reference voltage. The circuit can also include a second stage amplifier coupled with an output of the circuit and the first stage amplifier. Note that the output can be fed back to the first stage amplifier. Additionally, the circuit can include a module coupled with the second stage amplifier and can restrict current flow to the second stage amplifier and the output provided the circuit is in a sleep mode. Furthermore, the module can drive a terminal of the second stage amplifier to a logic low voltage provided the circuit is in the sleep mode.

20 Claims, 7 Drawing Sheets

SLEEP MODE RECOVERY

CROSS REFERENCE TO RELATED APPLICATIONS

This patent application claims benefit of co-pending U.S. Provisional Patent Application No. 60/506,712 which was filed on Sep. 25, 2003, and entitled "Fast Sleep Recovery Method For Low-Voltage, Low Power Unity Gain Amplifier" by Gary Moscaluk, which was assigned to the assignee of the present invention and is hereby incorporated by reference.

BACKGROUND

Analog circuits such as differential, common source or common drain or common gate amplifiers can be used to provide an abundance of functions ranging from a unity gain amplifier to a high frequency gain amplifier. Due to the demand for low-power integrated circuit (IC) chips, these particular analog circuits, in certain conditions can be disabled in order to eliminate or reduce the constant direct current (DC) consumption that is expended when active. This concept can be referred to as sleep mode. When these circuits are once again enabled or brought out of sleep mode, it is desirable that the analog circuits supply a stable output reference voltage as quickly as possible.

FIG. 1 is a conventional unity gain amplifier circuit 100 which is one of the many conventional solutions that may be used, where part of a first stage differential amplifier 102 supplies a bias voltage to a common source amplifier 106 of a second stage 104. When the circuits 102 and 104 are disabled (in sleep mode), the amplifier 100 is not conducting any current other than leakage current. When amplifier 100 is enabled from sleep mode by a sleep-bar signal 103, it is desirable that it recovers to provide a stable reference output voltage signal 110 as fast as possible. However, with compensation feedback implemented, which limits the recovery of the first stage differential amplifier 102, the amplifier 106 relies on the source/sink capability of the differential amplifier 102 to provide a fast recovery. In cases where increasing the current consumption capability is not feasible, a slow recovery of output reference signal 110 is realized.

A conventional technique of sleep recovery is to increase the source/sink capability of the differential amplifier 102 in order to meet the sleep recovery requirements. In other words, the conventional solution to this problem is to rely on the differential amplifier 102 to supply an output 108 with a stable voltage level 110 which results in higher current consumption for faster recovery from sleep mode.

One of the disadvantages associated with this conventional solution is that in order to meet sleep recovery specifications at low voltage and/or low-power situations, the differential amplifier 102 is designed for faster turn-on, which directly correlates to more current consumption, which may not be feasible in low-power applications. Additionally, this can lead to an area increase as well.

It would be desirable to have a solution that does not have the disadvantages of the conventional solution.

SUMMARY

One embodiment in accordance with the invention is a circuit. For example, the circuit can include a first stage amplifier coupled to receive a reference voltage. The circuit can also include a second stage amplifier coupled with an output of the circuit and the first stage amplifier. Note that the output can be fed back to the first stage amplifier. Additionally, the circuit can include a module coupled with the second stage amplifier and can restrict current flow to the second stage amplifier and the output provided the circuit is in a sleep mode. Furthermore, the module can drive a terminal of the second stage amplifier to a logic low voltage provided the circuit is in the sleep mode.

While a particular embodiment of the invention has been specifically described within this summary, it is noted that the invention is not limited to this embodiment. The invention is intended to cover alternatives, modifications and equivalents which may be included within the scope of the invention as defined by the claims.

DETAILED DESCRIPTION

Reference will now be made in detail to embodiments in accordance with the invention, examples of which are illustrated in the accompanying drawings. While the invention will be described in conjunction with embodiments, it will be understood that these embodiments are not intended to limit the invention. On the contrary, the invention is intended to cover alternatives, modifications and equivalents, which may be included within the scope of the invention as defined by the appended claims. Furthermore, in the following detailed description of embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Figure 2:
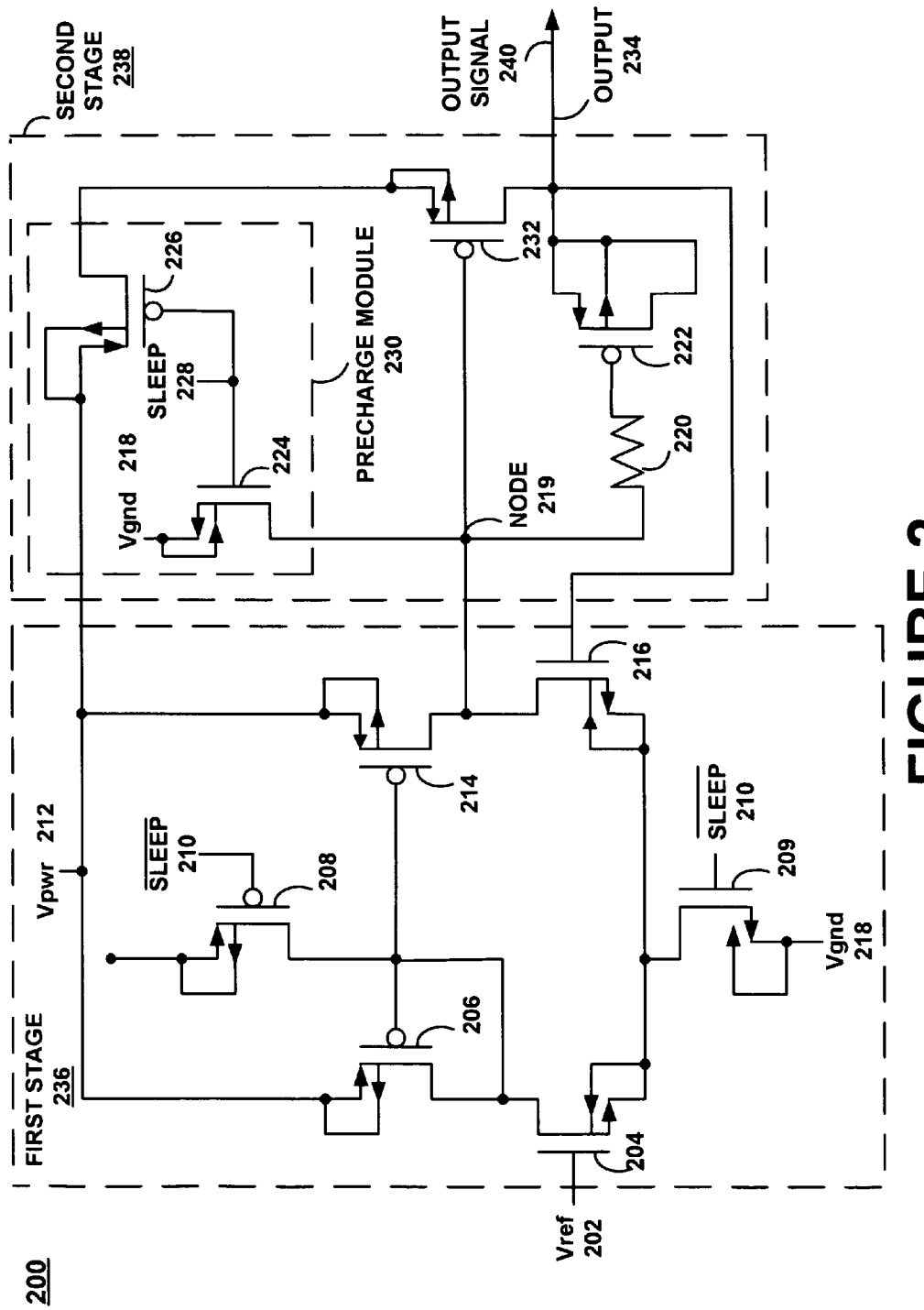
FIG. 2 is a schematic diagram of an exemplary amplifier in accordance with embodiments of the invention.

FIG. 2 is a schematic diagram of an exemplary unity gain amplifier circuit 200 in accordance with embodiments of the invention. Please note that in its various implementations, circuit 200 may not include all of the elements illustrated by FIG. 2, or circuit 200 may include other elements not shown by FIG. 2. A precharge module 230 can enable amplifier circuit 200 to produce a faster stable output voltage reference level 240 than a differential first stage amplifier 236 by itself can provide when amplifier 200 is enabled or activated from a sleep or standby mode.

When sleep or standby mode is invoked in amplifier 200, the differential input first stage amplifier 236 is disabled. For a second stage common-source network 238, a "sleep" signal 228 (which can be buffered beforehand) can be used to turn off a transistor 226 of the precharge module 230, thereby preventing current flow to a transistor 232 (which can be referred to as the amplifier of second stage 238) that can result in an infinite impedance path to its drain. At the same time, a transistor 224 supplies a low voltage (e.g., logic "0") on the gate of transistor amplifier device 232. When the sleep or standby mode is disabled, transistor 226 can be turned on which supplies a full supply voltage ($V_{pwr}$) 212 on its drain. Since the differential input first stage 236 does not respond as fast as transistor 226 does to the sleep mode being disabled, the low voltage (e.g., logic "0") precharged on the gate of transistor 232 drives an output 234 of amplifier 200 quickly towards the voltage source ($V_{pwr}$ or $V_{DD}$) 212. It is appreciated that the voltage at output 234 is fed back to the gate of a transistor 216 thereby "jump starting" the differential input first stage amplifier 236 which provides a much improved recovery time for a stable output voltage signal 240. Note that output voltage signal 240 of amplifier 200 can be referred to as a buffered bandgap voltage signal 240.

Within FIG. 2, the gate of transistor 204 can be coupled to receive a reference voltage ($V_{ref}$) 202, which can be referred to as an input bandgap voltage. It is noted that the gate of transistor 204 can be an external input to amplifier 200. The amplifier 200 can be implemented as a low voltage, low power unity gain amplifier. As such, amplifier 200 can try to duplicate the voltage value of $V_{ref}$ 202 at its output 234.

When amplifier 200 is in sleep mode, a sleep signal 228 can be a high voltage (e.g., logic "1") signal while a sleep-bar signal 210 can be a low voltage (e.g., logic "0") signal. As such, a transistor 224 will be turned on and conducting thereby causing ground or a low voltage (e.g., logic "0") on the gate of transistor 232. However, since transistor 226 is turned off (which is in series with transistor 232), output signal 240 is a low voltage signal (e.g., logic "0") or at ground.

Within FIG. 2, amplifier 200 can come out of the sleep mode when sleep signal 228 goes to a low voltage (e.g., logic "0") which causes transistor 226 to be turned on. And since the gate of transistor 232 is already precharged at a ground voltage, or a low voltage (e.g., logic "0"), a substantial amount of current from voltage power source ($V_{pwr}$) 212 flows through both transistors 226 and 232 to the output 234 thereby causing output signal 240 to sharply pull up towards $V_{pwr}$ 212. And since the output 234 is fed back to the gate of transistor 216 which is an input of the first stage 236, output signal 240 can "jump start" the first stage 236. The output signal 240 turns on first stage 236 since there is a large voltage differential setup on the first stage 236. As such, output signal 240 is basically going to jump start the first stage 236 and really amplify the differential so that the voltage at the drains of transistors 214 and 216 will sharply rise. As a result, the voltage at the drains of transistors 214 and 216 has a large transition towards $V_{pwr}$ 212, then the first stage 236 settles to its operating voltage. Therefore, the output signal 240 goes to a stable voltage reference value similar to the voltage value of an input reference voltage ($V_{ref}$) 202.

Specifically, when amplifier 200 is in a sleep or standby state, sleep-bar signal 210 can be a low voltage (e.g., logic "0") while sleep signal 228 can be a high voltage (e.g., logic "1"). Note that the sleep signal 228 and the sleep-bar signal 210 can be external signals to amplifier 200. That is, sleep signal 228 and sleep-bar signal 210 can be received by amplifier 200 in a manner similar to the way it receives $V_{ref}$ signal 202. Since the gate of transistor 208 is at a low voltage (e.g., logic "0") and its source is at a high voltage (e.g., logic "1"), transistor 208 is turned on thereby supplying $V_{pwr}$ 212 on the gates of transistors 206 and 214. As such, transistors 206 and 214 are turned off since there is a high voltage (e.g., logic "1") at their gates, bodies, and sources.

Moreover, transistor 226 of precharge module 230 is turned off since its gate is at the high voltage (e.g., logic "1") of sleep signal 228 and its source and body are at the high voltage (e.g., logic "1") of $V_{pwr}$ 212. The transistor 224 is turned on since its gate is at the high voltage (e.g., logic "1") of sleep signal 228 and its source is at low voltage (e.g., logic "0") of $V_{gnd}$ 218. As such, transistor 224 pulls node 219 to the low voltage (e.g., logic "0") of $V_{gnd}$ 218. Specifically, transistor 224 pulls the gate of transistor 232, the gate of transistor 222 via resistor 220, and the drains of transistors 214 and 216 to the low voltage (e.g., logic "0") of $V_{gnd}$ 218. Transistor 232 remains off since its drain is floating due to transistor 226 being off and its source is at a low voltage (e.g., logic "0"). As such, output 234 is at a low voltage (e.g., logic "0") since it is coupled to a load (not shown). Since the source, body, and drain of transistor 222 are coupled together, it is understood that transistor 222 acts as a capacitor. It is appreciated that transistor 209 is turned off since its source is at the low voltage (e.g., logic "0") of $V_{gnd}$ 218 and its gate is at the low voltage (e.g., logic "0") of sleep-bar signal 210 resulting in substantially no current flowing through it. Note that $V_{ref}$ 202 can be implemented at approximately 1.2 volts (V) and output 234 can be at ground or a low voltage (e.g., logic "0"). Since the gate of transistor 216 is at the low voltage (e.g., logic "0") of output 234 and transistor 209 is turned off, the sources of transistors 216 and 204 are floating at some intermediate voltage, e.g., close to a low voltage such as logic "0".

Within FIG. 2, when sleep signal 228 goes to a low voltage (e.g., logic "0") and sleep-bar signal 210 goes to a high voltage (e.g., logic "1"), amplifier 200 is activated or enabled from the sleep or standby mode. Note that sleep signal 228 and sleep-bar signal 210 are trigger signals for causing amplifier 200 to exit and enter sleep mode. As such, transistor 226 is turned on because its gate is at the low voltage (e.g., logic "0") of sleep signal 228 and its source is at the high voltage (e.g., logic "1") of $V_{pwr}$ 212. Since the differential input first stage 236 does not respond as quickly as transistor 226 does to the sleep mode being disabled, the low voltage (e.g., logic "0") precharged on the gate of transistor 232 drives output 234 quickly towards $V_{pwr}$ 212. Specifically, transistor 232 is turned on since its source is at the high voltage (e.g., logic "1") of $V_{pwr}$ 212 and its gate is still at the low voltage (e.g., logic "0") of $V_{gnd}$ 218, thereby automatically pulling output 234 and output signal 240 towards the high voltage (e.g., logic "1") of $V_{pwr}$ 212. Note that module 230 (via transistor 226) can selectively couple $V_{pwr}$ 212 to the second stage amplifier 232 and output 234.

Transistor 209 is turned on since its gate is at the high voltage (e.g., logic "1") of sleep-bar signal 210 and its source is at the low voltage (e.g., logic "0") of $V_{gnd}$ 218 thereby providing a path to $V_{gnd}$ 218. Furthermore, transistor 204 is turned on since its gate is at the high voltage (e.g., logic "1") of $V_{ref}$ signal 202 and its source is at the low voltage (e.g., logic "0") of $V_{gnd}$ 218. Moreover, since the high voltage (e.g., logic "1") at output 234 is fed back to the gate of transistor 216, the first stage amplifier 236 is "jump started" resulting in an improved recovery time for a stable output voltage signal 240. Specifically, since the high voltage (e.g., logic "1") at output 234 is fed back to the gate of transistor 216 of first stage 236, transistor 216 is turned on since its source is at the low voltage (e.g., logic "0") of $V_{gnd}$ 218. In this manner, there is current flowing to $V_{gnd}$ 218 through transistors 204 and 216.

Additionally, transistors 206 and 214 are both turned on since the first stage 236 essentially acts as a current mirror. Specifically, since sleep-bar signal 210 is at the high voltage (e.g., logic "1"), there is some intermediate voltage at the gates of transistors 206 and 214 along with the drain of transistor 204 thereby resulting in the activation of transistors 206 and 214. As such, node 219 is going to go to some steady state value which adjusts the voltage on output 234 because the gate to source voltage (Vgs) of transistor 232 will change. Therefore, node 219 goes to a steady state value, output signal 240 goes to a steady state output value, which is fed back to the gate of transistor 216 of the first state 236. Eventually, the voltage value of $V_{ref}$ signal 202 and output reference voltage signal 240 will be similar.

Within FIG. 2, the precharge module 230 can essentially "jump start" the differential first stage amplifier 236 by "precharging" the gate of transistor 232 at ground or a low voltage (e.g., logic "0") before amplifier 200 comes out of a sleep or standby mode. When implemented in this manner, the output 234 and output signal 240 can be strongly pulled towards the high voltage (e.g., logic "1") of $V_{pwr}$ 212 thereby causing the first stage 236 to turn on much quicker. As such, amplifier circuit 200 can generate a stable output reference voltage 240 in a faster manner than conventional techniques. Note that precharge module 230 can provide this performance improvement to amplifier 200 without increasing current sinking or sourcing capability via the differential first stage amplifier 236.

One of the advantages of including precharge module 230 as part of amplifier 200 is that it can dramatically decrease recovery time from sleep or standby mode (or any other mode where an analog circuit is disabled) without affecting its performance or stability characteristics. It is understood that this is valuable to designers of low power systems where devices are frequently in a low power or sleep mode until enabled for use. Another advantage is the minimal area utilized by precharge module 230 for providing the speed recovery improvement to amplifier 200.

Within FIG. 2, it is noted that the sleep-bar signal 210 is coupled to the gates of transistors 208 and 209. As such, when sleep-bar signal 210 is a low voltage (e.g., logic "0"), there is substantially no current path from $V_{pwr}$ 212 to $V_{gnd}$ 218 thereby resulting in substantially no current consumption for the first stage 236. In this manner, if $V_{pwr}$ 212 is associated with some type of battery power, that battery power can be conserved when amplifier 200 is in a sleep or standby mode.

The gate of transistor 204 can be coupled to receive reference voltage 202 while its drain can be coupled with the drains of transistors 206 and 208 along with the gates of transistors 206 and 214. Additionally, the source and body of transistor 204 can be coupled with the source and body of transistor 216 along with the drain of transistor 209. The gate of transistor 209 can be coupled to receive sleep-bar signal 210 while its source and body can be coupled with $V_{gnd}$ 218. Note that the body of transistor 209 can be biased to $V_{gnd}$ 218. The source and body of transistor 216 can be coupled with the drain of transistor 209 while the gate of transistor 216 can be coupled with the drain of transistor 232 along with the drain, source, and body of transistor 222. Furthermore, the drain of transistor 216 can be coupled with the gate of transistor 232, a first terminal of resistor 220, and the drains of transistors 214 and 224. The gate of transistor 214 can be coupled with the gate and drain of transistor 206 along with the drain of transistor 208. The source and body of transistor 214 can be coupled with $V_{pwr}$ 212. The source and body of transistor 208 can be coupled with $V_{pwr}$ 212 while its gate can be coupled to receive sleep-bar signal 210 and its drain can be coupled with the drains of transistors 204 and 206 along with the gates of transistors 206 and 214. The source and body of transistor 206 can be coupled with $V_{pwr}$ 212. Note that each body of transistors 206, 208, and 214 can be biased to $V_{pwr}$ 212.

Within FIG. 2, the source and body of transistor 226 can be coupled with $V_{pwr}$ 212 while its drain can be coupled with the source and body of transistor 232. Note that the body of transistor 226 can be biased to $V_{pwr}$ 212. Additionally, the gate of transistor 226 can be coupled with the gate of transistor 224 and also coupled to receive sleep signal 228. The source and body of transistor 224 can be coupled with $V_{gnd}$ 218 while its drain can be coupled to the drains of transistors 214 and 216. Furthermore, the drain of transistor 224 can be coupled with the gate of transistor 232 and the first terminal of resistor 220. Note that the body of transistor 224 can be biased to $V_{gnd}$ 218. The gate of transistor 222 can be coupled with a second terminal of resistor 220 while its drain, source, and body can be coupled with the drain of transistor 232 and the gate of transistor 216.

Note that each of transistors 204, 206, 208, 209, 214, 216, 222, 224, 226, and 232 can be implemented in a wide variety of ways in accordance with embodiments of the invention. For example, each of transistors 206, 208, 214, 222, 226, and 232 can be implemented as, but is not limited to, a P-channel MOSFET (metal-oxide semiconductor field-effect transistor) which is also known as a PMOS. Furthermore, each of transistors 204, 209, 216, and 224 can be implemented as, but is not limited to, a N-channel MOSFET which is also known as a NMOS. It is appreciated that each of transistors 204, 206, 208, 209, 214, 216, 222, 224, 226, and 232 can be implemented as, but is not limited to, a PMOS, a NMOS, or any other type of transistor. It is noted that each of transistors 204, 206, 208, 209, 214, 216, 222, 224, 226, and 232 can be referred to as a switching element. It is understood that transistor 222 can be implemented as, but is not limited to, a capacitor, or capacitors coupled in parallel.

Within FIG. 2, it is understood that each of transistors 204, 206, 208, 209, 214, 216, 222, 224, 226, and 232 can be fabricated to have a variety of different width to length (W/L) ratios.

It is appreciated that amplifier 200 is well suited to be implemented in a wide variety of ways. For example, resistor 220 may be coupled in parallel with one or more resistors. Note that resistor 220 and transistor 222 can be referred to as a compensation network that can provide stability for amplifier 200 so that it does not oscillate or get into an unstable state once amplifier 200 comes out of a sleep mode or receives some noise associated with it. The resistor 220 can be implemented with diverse resistance values. For example, resistor 220 can be implemented with about 16,000 ohms, but is not limited to such. Noted that amplifier 200 is not limited in any way to the embodiments mentioned herein.

Figure 3A:
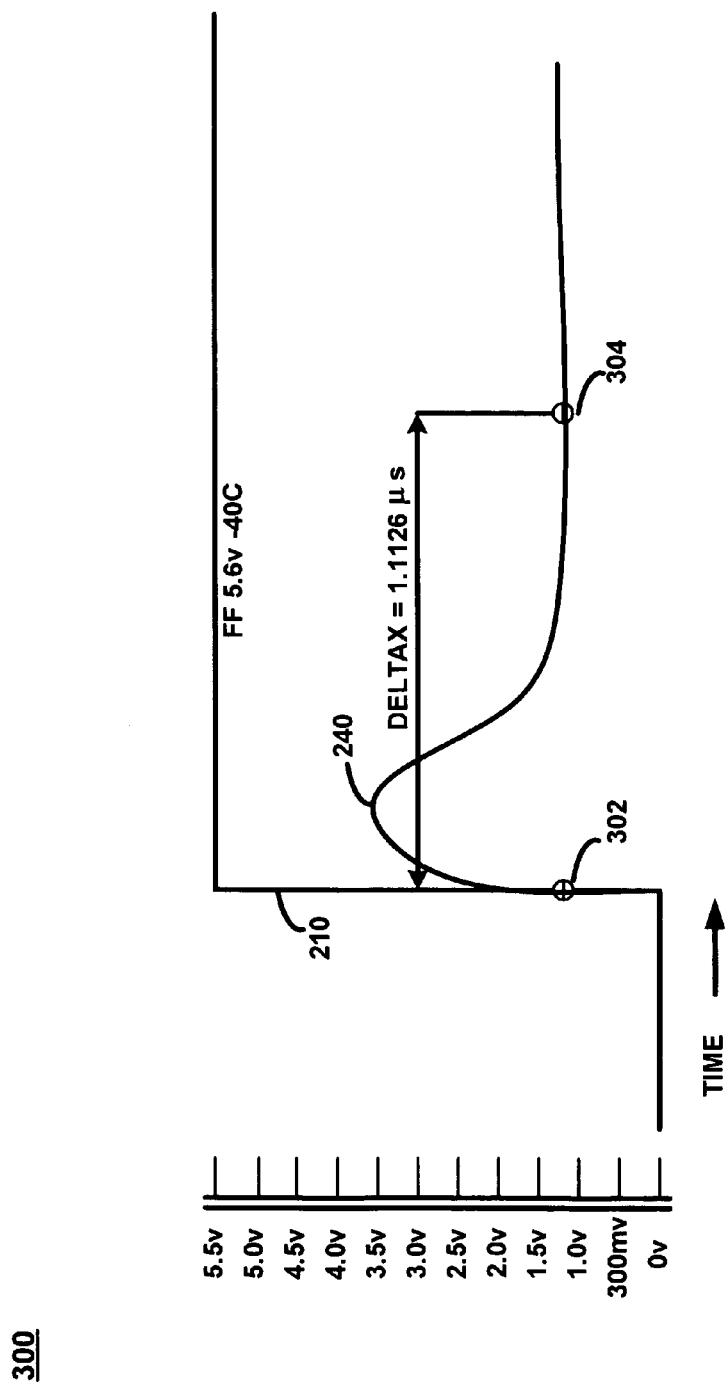
FIG. 3A is a chart in accordance with embodiments of the invention that includes exemplary simulation results based on a first set of conditions.

FIG. 3A is a chart 300 in accordance with embodiments of the invention that illustrates exemplary simulation results of amplifier 200 of FIG. 2 under a first set of simulation conditions. Specifically, the first set of simulation conditions of amplifier 200 can include a high voltage of 5.6 V and low temperature of −40 degrees Celsius (C) along with utilizing fast P-channel and fast N-channel transistors (FF).

Within chart 300, once sleep-bar signal 210 of amplifier 200 goes to a high voltage of approximately 5.6 V at start point 302, output signal 240 sharply rises from a voltage value of zero towards the voltage value of $V_{pwr}$ 212, levels off at approximately 3.25 V, and then transitions back to its steady state of approximately 1.2 V at endpoint 304. It is understood that the sleep recovery time of output signal 240 from sleep mode to its steady state voltage is approximately 1.1126 microseconds (µs), which is determined by the amount of time between start point 302 and endpoint 304.

Figure 1:
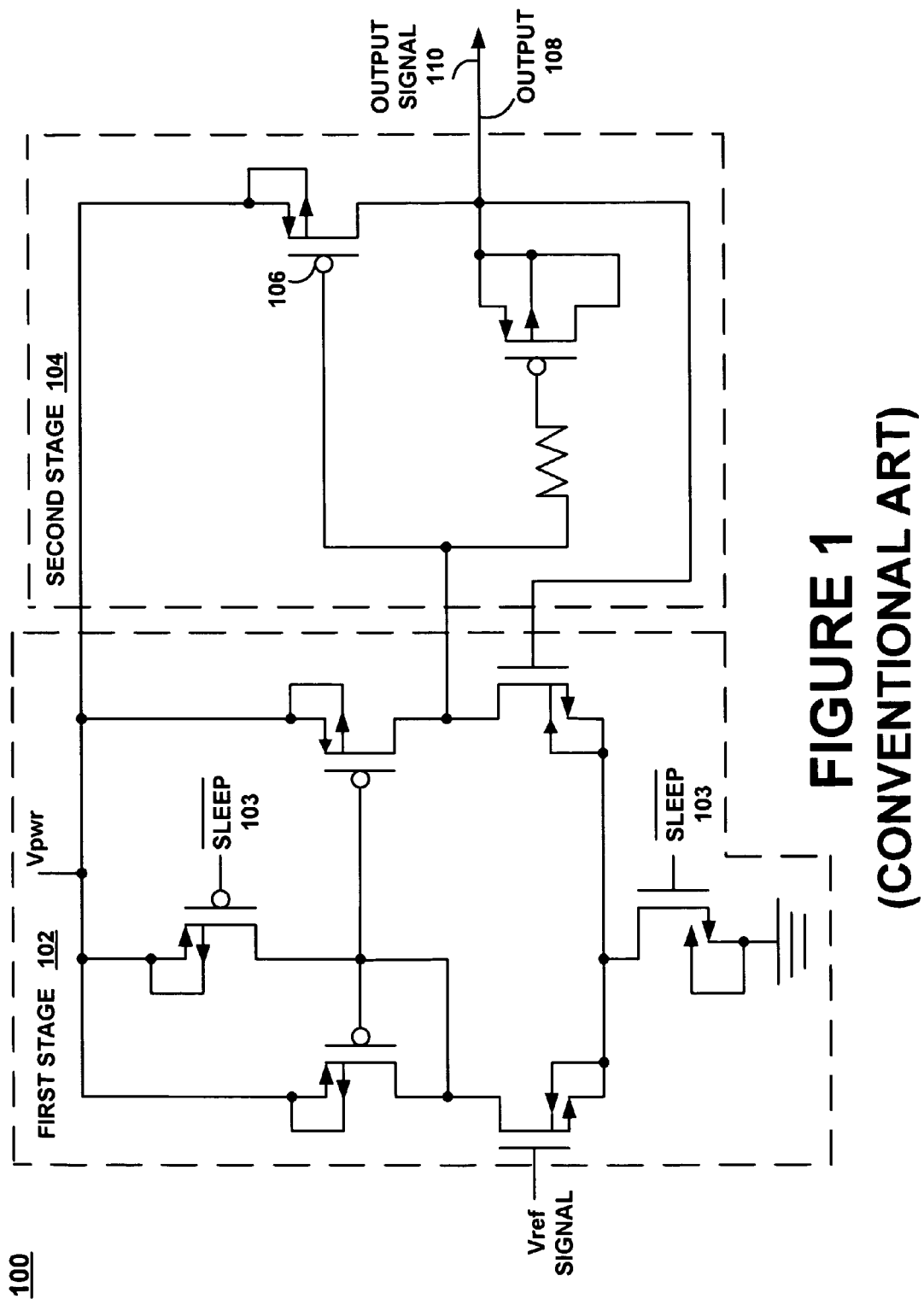
FIG. 1 is a schematic diagram of a conventional unity gain amplifier.
Figure 4A:
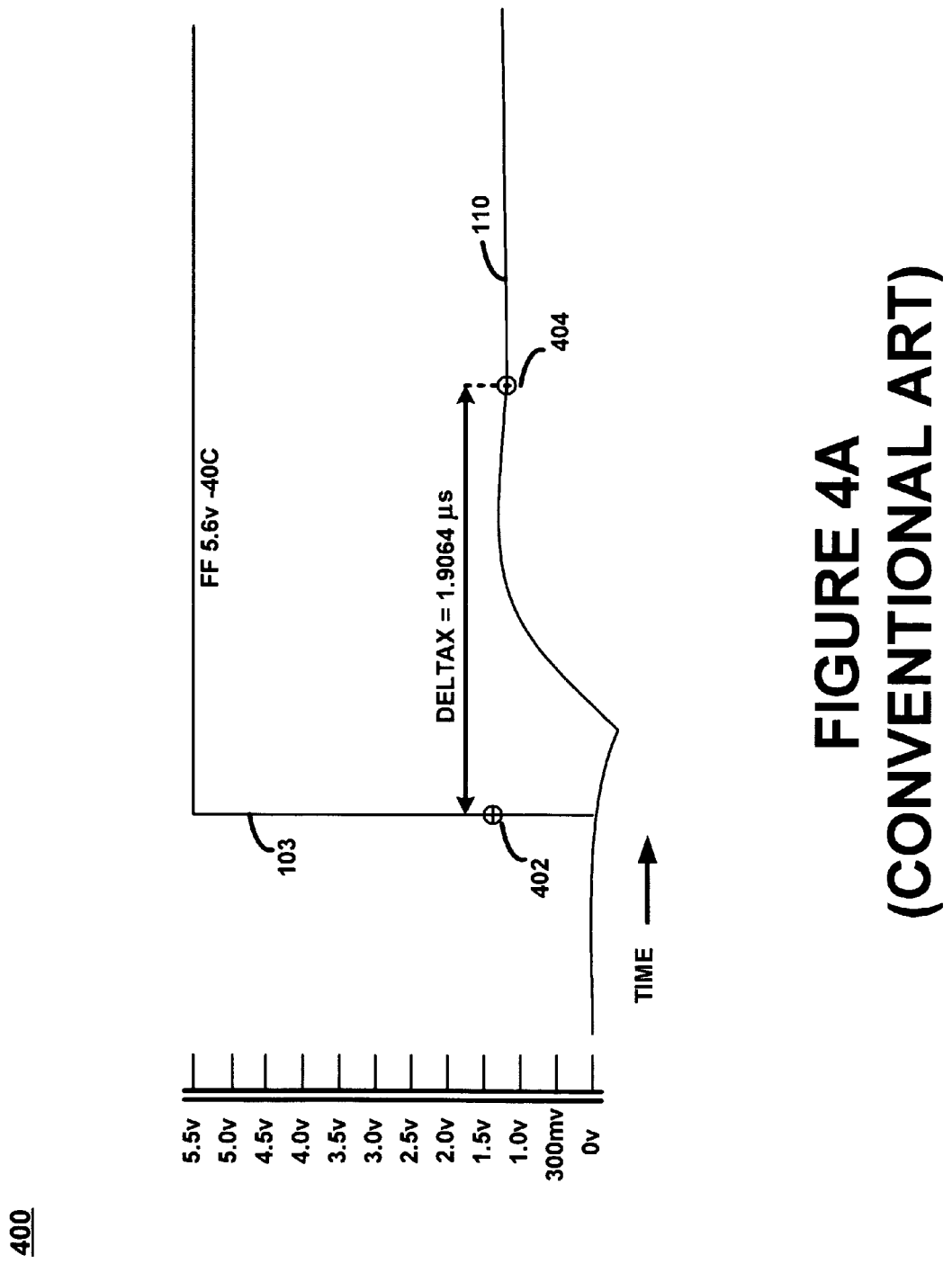
FIG. 4A is a chart that includes conventional simulation results based on the first set of conditions.

By way of comparison, FIG. 4A is a chart 400 that illustrates simulation results of conventional amplifier 100 of FIG. 1 under the first set of simulation conditions similar to those of chart 300. As shown in chart 400, once sleep-bar signal 103 of amplifier 100 goes to approximately 5.6 V at start point 402, output signal 110 starts at a voltage value of zero to then dip below the zero voltage and then transitions up to its steady state of approximately 1.2 V at endpoint 404. Note that the sleep recovery time of output signal 110 from sleep mode to its steady state voltage is approximately 1.9064 µs, which is determined by the amount of time between start point 402 and endpoint 404. Therefore, the sleep recovery time of amplifier 200 shown in chart 300 (in accordance with embodiments of the invention) is approximately 1.7 times faster than the recovery time of the conventional amplifier 100 shown in chart 400.

Figure 3B:
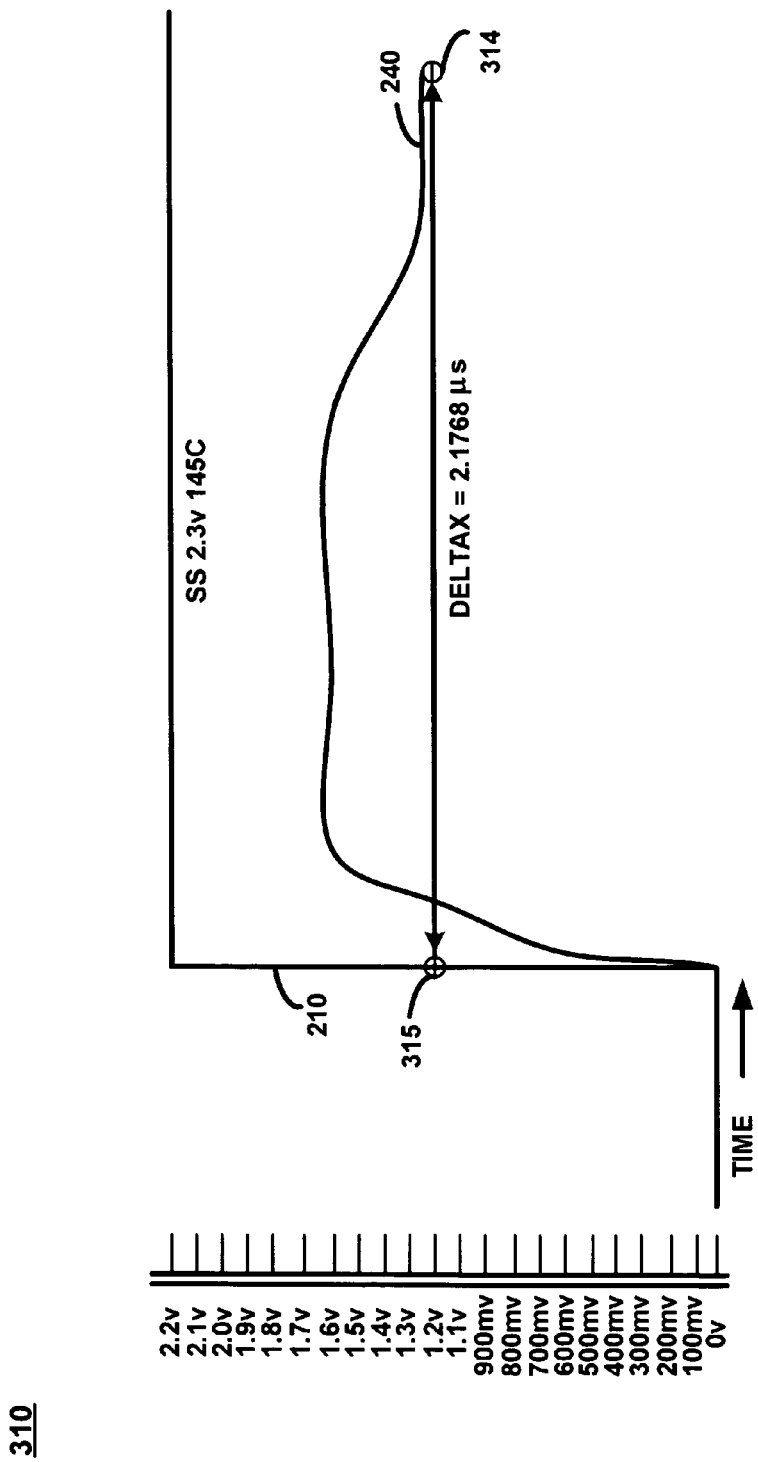
FIG. 3B is a chart in accordance with embodiments of the invention that includes exemplary simulation results based on a second set of conditions.

FIG. 3B is a chart 310 in accordance with embodiments of the invention that illustrates exemplary simulation results of amplifier 200 of FIG. 2 under a second set of simulation conditions. Specifically, the second set of simulation conditions of amplifier 200 can include a lower voltage of 2.3 V and high temperature of 145 degrees C. along with utilizing slow P-channel and slow N-channel transistors (SS).

Within chart 310, once sleep-bar signal 210 of amplifier 200 goes to a lower voltage of approximately 2.3 V at start point 312, output signal 240 sharply rises from a voltage value of zero towards the voltage value of $V_{pwr}$ 212, levels off at approximately 1.65 V, and then transitions back to its steady state voltage of approximately 1.2 V at endpoint 314. It is appreciated that the sleep recovery time of output signal 240 from sleep mode to its steady state voltage is approximately 2.1768 µs, which is determined by the amount of time between start point 312 and endpoint 314.

Figure 4B:
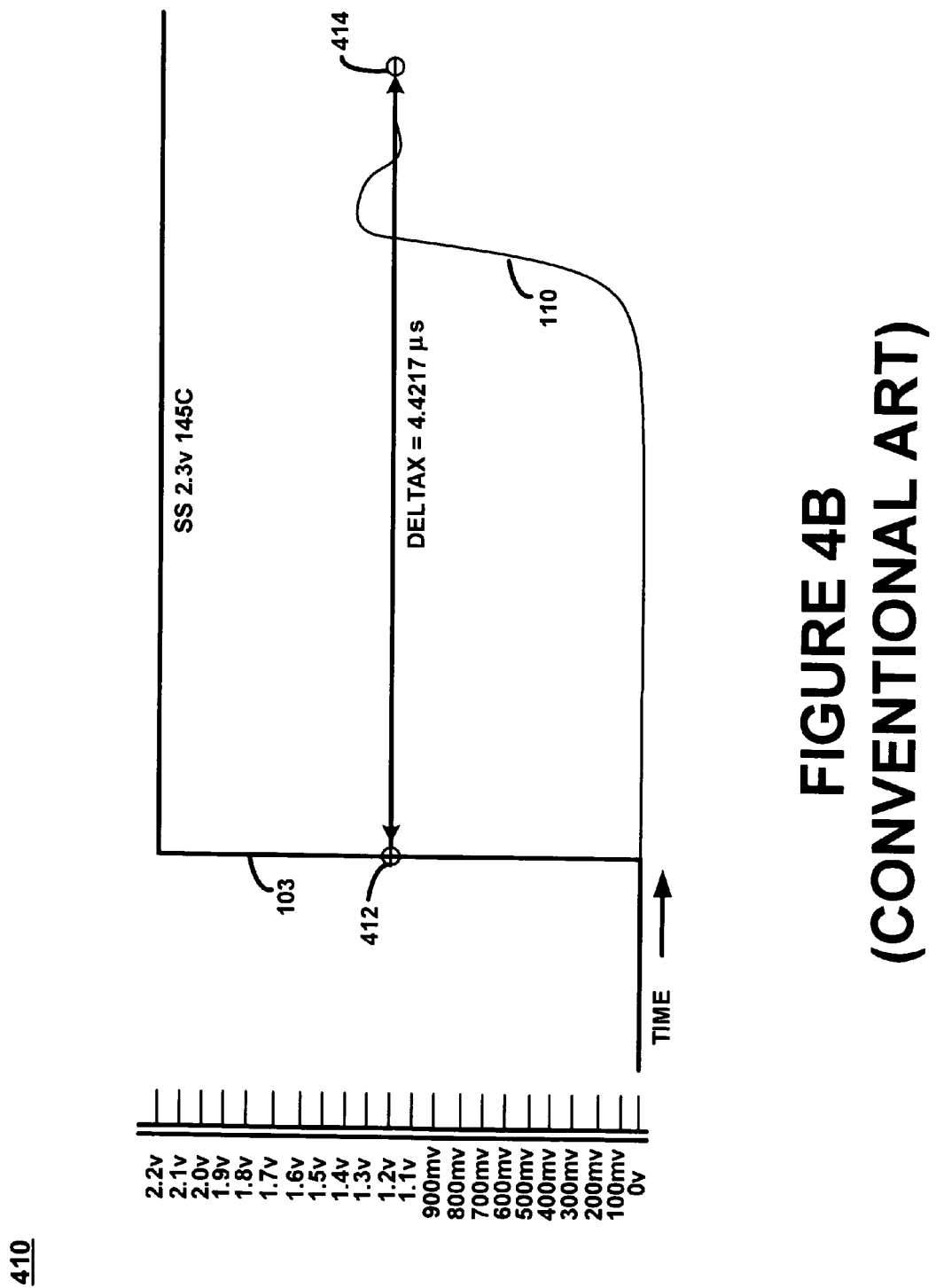
FIG. 4B is a chart that includes conventional simulation results based on the second set of conditions.

By way of comparison, FIG. 4B is a chart 410 that illustrates simulation results of conventional amplifier 100 of FIG. 1 under simulation conditions similar to those of chart 310. Specifically, once sleep-bar signal 103 of amplifier 100 goes to approximately 2.3 V at start point 412, output signal 110 starts at a voltage value of zero and slowly transitions towards the voltage value of $V_{pwr}$ 212, peaks at approximately 1.35 V, and then transitions back to its steady state of approximately 1.2 V at endpoint 414. Note that the sleep recovery time of output signal 110 from sleep mode to its steady state voltage is approximately 4.4217 µs, which is determined by the amount of time between start point 412 and endpoint 414. Therefore, the sleep recovery time of amplifier 200 shown in chart 310 (in accordance with embodiments of the invention) is approximately 2 times faster than the recovery time of the conventional amplifier 100 shown in chart 410.

Figure 5:
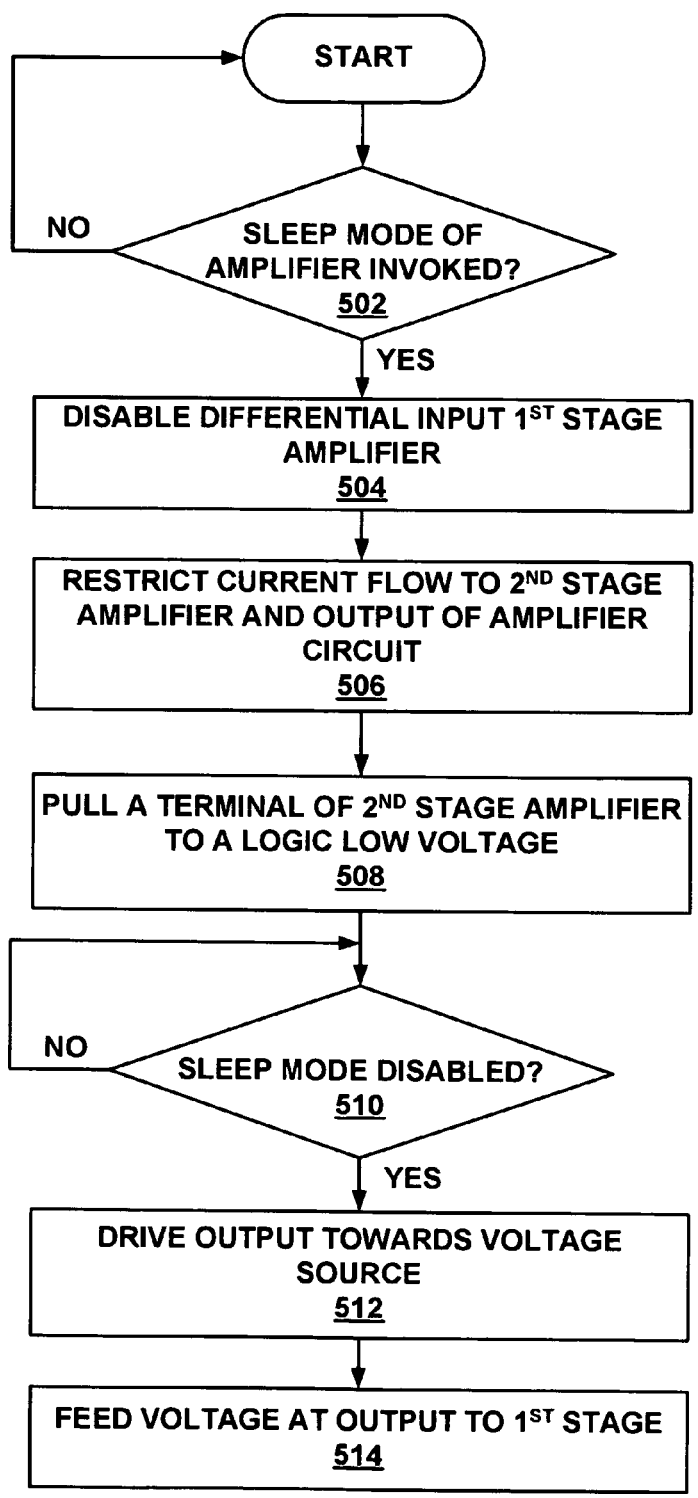
FIG. 5 is a flowchart of a method in accordance with embodiments of the invention.

FIG. 5 is a flowchart of a method 500 in accordance with embodiments of the invention for improving sleep recovery time of an amplifier circuit. Although specific operations are disclosed in method 500, such operations are exemplary. That is, method 500 may not include all of the operations illustrated by FIG. 5. Alternatively, method 500 may include various other operations and/or variations of the operations shown by FIG. 5.

Specifically, a determination can be made as to whether a sleep mode has been invoked for an amplifier circuit. If not, the determination can be continually repeated. However, if the sleep mode is invoked, a differential input first stage amplifier of the amplifier circuit can be disabled. Additionally, current flow can be restricted to a second stage amplifier and an output of the amplifier circuit. A terminal of the second stage amplifier can be pulled to a logic low voltage. A determination can then be made as to whether the sleep mode has been disabled. If not, the determination can be continually repeated. However, if the sleep mode has been disabled, the output of the amplifier circuit can be driven towards a voltage source. Furthermore, the output voltage can be fed to the first stage amplifier.

At operation 502 of FIG. 5, a determination can be made as to whether a sleep or standby mode has been invoked or initiated for an amplifier circuit (e.g., 200). If not, process 500 proceeds to the beginning of operation 502 so that the determination can be repeated. However, if the sleep or standby mode has been invoked for the amplifier circuit at operation 502, process 500 proceeds to operation 504. Note that the sleep or standby mode of operation 502 can be invoked in any manner similar to that described herein, but is not limited to such.

At operation 504, a differential input first stage amplifier (e.g., 236) of the amplifier circuit can be disabled or enters a sleep or standby mode. It is understood that the differential input first stage amplifier can be disabled in any manner similar to that described herein, but is not limited to such.

At operation 506 of FIG. 5, current flow can be restricted (or limited) to a second stage amplifier (e.g., 232) and an output (e.g., 234) of the amplifier circuit. It is appreciated that the current flow to the second stage amplifier can be prevented, restricted, or limited in any manner similar to that described herein, but is not limited to such.

At operation 508, a terminal of the second stage amplifier can be pulled (or driven or discharged) to a logic low voltage. Note that the logic low voltage can be, but is not limited to, ground (e.g., $V_{gnd}$ 212), a low voltage, and a logic "0" voltage. The second stage amplifier can be implemented as a transistor (e.g., 232), but is not limited to such. The terminal of the second stage amplifier can be implemented as a gate of a transistor (e.g., 232), but is not limited to such. It is understood that the terminal of the second stage amplifier can be pulled (or driven or discharged) to a logic low voltage in any manner similar to that described herein, but is not limited to such.

At operation 510, a determination can be made as to whether the sleep or standby mode has been disabled or deactivated. If not, process 500 proceeds to the beginning of operation 510 so that the determination can be repeated. However, if the sleep or standby mode has been disabled at operation 510, process 500 proceeds to operation 512. Note that the sleep or standby mode of operation 510 can be disabled in any manner similar to that described herein, but is not limited to such.

At operation 512 of FIG. 5, the output (e.g., 234) of the amplifier circuit can be driven towards a voltage source (e.g., $V_{pwr}$ 212). It is understood that the output of the amplifier circuit can be driven towards a voltage source in any manner similar to that described herein, but is not limited to such.

At operation 514, the voltage driven onto the output of the amplifier can be fed to the first stage amplifier. Note that the voltage can "jump start" the first stage amplifier causing the output of the amplifier circuit to more quickly reach its stable output reference voltage thereby resulting in a quicker sleep recovery time. It is appreciated that the output of the amplifier can be fed to the first stage amplifier in any manner similar to that described herein, but is not limited to such. At the completion of operation 514, process 500 can be exited.

Note that a gate, a drain, and a source of a transistor can each be referred to as a terminal of its transistor. Additionally, the gate of a transistor can also be referred to as a control terminal of its transistor.

The foregoing descriptions of specific embodiments of the invention have been presented for purposes of illustration and description. They are not intended to be exhaustive or to limit the invention to the precise forms disclosed, and obviously many modifications and variations are possible in light of the above teaching. It is intended that the scope of the invention be defined by the claims appended hereto and their equivalents.

What is claimed is:

1. A circuit comprising:
   a first stage amplifier coupled to receive a reference voltage;
   a second stage amplifier coupled with an output of said circuit and said first stage amplifier, said output fed back to said first stage amplifier; and
   a module coupled with said second stage amplifier and for restricting current flow to said second stage amplifier and said output provided said circuit is in a sleep mode, said module for driving a terminal of said second stage amplifier to a logic low voltage provided said circuit is in said sleep mode.

2. The circuit of claim 1, wherein said module for selectively coupling a voltage supply to said second stage amplifier and said output provided said sleep mode is disabled.

3. The circuit of claim 2, wherein said first stage amplifier is "jump started" upon receiving said voltage supply, provided said sleep mode is disabled.

4. The circuit of claim 1, wherein said module comprises a switching element coupled with said terminal of said second stage amplifier.

5. The circuit of claim 4, wherein said switching element is coupled with ground.

6. The circuit of claim 1, wherein said module comprises a switching element coupled with a second terminal of said second stage amplifier.

7. The circuit of claim 6, wherein said switching element is coupled with a voltage source.

8. A method comprising:
   pulling a terminal of a second stage amplifier to a logic low voltage provided a sleep mode is invoked;
   restricting current flow to said second stage amplifier and a circuit output provided said sleep mode is invoked;
   driving said circuit output towards a voltage source provided said sleep mode is disabled; and
   feeding voltage at said output to a first stage amplifier provided said sleep mode is disabled, said first stage amplifier coupled with said second stage amplifier.

9. The method as described in claim 8, wherein said pulling performed by a switching element coupled with ground.

10. The method as described in claim 9, wherein said restricting performed by a second switching element coupled with said voltage source, said second switching element coupled with said switching element.

11. The method as described in claim 8, wherein said restricting performed by a switching element coupled with said voltage source.

12. The method as described in claim 8, wherein said circuit is an amplifier circuit.

13. The method as described in claim 8, wherein said second stage amplifier comprises a transistor.

14. The method as described in claim 8, wherein said first stage amplifier comprises a transistor coupled to receive a voltage reference signal.

15. A circuit comprising:
   means for discharging a terminal of a second stage amplifier to a logic low voltage provided a sleep mode is invoked;
   means for preventing current flow to said second stage amplifier and an output of said circuit provided said sleep mode is invoked;
   means for driving said output towards a voltage supply provided said sleep mode is disabled; and
   means for feeding voltage at said output to a first stage amplifier provided said sleep mode is disabled, said first stage amplifier coupled with said second stage amplifier.

16. The circuit of claim 15, wherein said means for discharging comprises a switching element coupled with ground.

17. The circuit of claim 16, wherein said means for restricting comprises a second switching element coupled with a voltage source, said second switching element coupled with said switching element.

18. The circuit of claim 15, wherein said means for restricting comprises a switching element coupled with a voltage source.

19. The circuit of claim 15, wherein said second stage amplifier comprises a transistor.

20. The circuit of claim 15, wherein said first stage amplifier comprises a transistor coupled to receive a reference voltage signal.

* * * * *